United States Patent [19]

Edmond et al.

[11] Patent Number: 5,393,993
[45] Date of Patent: Feb. 28, 1995

[54] BUFFER STRUCTURE BETWEEN SILICON CARBIDE AND GALLIUM NITRIDE AND RESULTING SEMICONDUCTOR DEVICES

[75] Inventors: John A. Edmond, Apex; Vladimir Dmitriev, Fuquay-Varina; Kenneth Irvine, Cary, all of N.C.

[73] Assignee: Cree Research, Inc., Durham, N.C.

[21] Appl. No.: 166,229

[22] Filed: Dec. 13, 1993

[51] Int. Cl.$^6$ ............................................. H01L 33/00
[52] U.S. Cl. ........................................ 257/77; 257/94; 257/103
[58] Field of Search ......................... 257/77, 94, 103; 437/107

[56] References Cited

U.S. PATENT DOCUMENTS

| | | | |
|---|---|---|---|
| 5,122,845 | 6/1992 | Manabe | 257/94 |
| 5,210,051 | 5/1993 | Carter, Jr. | |
| 5,281,830 | 1/1994 | Kotaki | 257/94 |

FOREIGN PATENT DOCUMENTS 297654  1/1989  European Pat. Off. ............ 257/103

OTHER PUBLICATIONS

I. Akasaki, et al., "Conductivity Control of AlGaN, Fabrication of AlGaN/GaN Multi–Heterostructure and Their Application to UV/Blue Light Emitting Devices," Wide Band Gap Semiconductors Symposium, Boston, Mass., 1992, pp. 383–394.

T. L. Chu, "Gallium Nitride Films," J. Electrochemical Society, Jul. 1971, pp. 1200–1203.

S. Yoshida, et al., "Improvements on the electrical and luminescent properties of reactive molecular beam epitaxially grown GaN films by using AlN-coated sapphire substrates," Appl. Phys. Lett., vol. 42, No. 5, Mar. 1983, pp. 427–429.

Shuji Nakamura, "GaN Growth Using GaN Buffer Layer," Japanese Journal of Applied Physics, vol. 30, No. 10A, Oct. 1991, pp. L1705–L1707.

M. E. Lin, et al., "A comparative study of GaN epilayers grown on sapphire and SiC substrates by plasma-assisted molecular-beam epitaxy," Appl Phys. Lett., vol. 62, Jun. 1993, pp. 3479–3481.

Isamu Akaski, et al., "Effects of AlN Buffer Layer on Crystallographic Structure and on Electrical and Optical Properties of GaN and $Ga_{1-x}Al_xN$ ($0 < x \leq 0.4$) Films Grown on Sapphire Substrate by MOVPE," Journal of Crystal Growth, vol. 98, 1989, pp. 209–219.

J. N. Kuznia, et al., "Influence of buffer layers of the deposition of high quality single crystal GaN over sapphire substrates," J. Appl. Phys., vol. 73, No. 9, May 1993, pp. 4700–4702.

H. Amano, et al., "Metalorganic vapor phase epitaxial growth of a high quality GaN film using an AlN buffer layer," Appl. Phys. Lett., vol. 48, No. 5, Feb. 1986, pp. 353–355.

Shuji Nakamura, et al., "High-power InGaN/GaN double-heterostructure violet light emitting diodes," Appl. Phys. Lett., vol. 62, No. 19, May 1993, pp. 2390–2392.

Barbara Goldenberg, et al., "Ultraviolet and violet light-emitting GaN diodes grown by low-pressure metalorganic chemical vapor deposition," Appl. Phys. Lett., vol. 62, No. 4, Jan. 1993, pp. 381–383.

S. Strite, et al., "GaN, AlN, and InN: A Review," J. Vac. Sci. Technol. B., vol. 10, No. 4, Jul./Aug. 1992, pp. 1237–1266.

Primary Examiner—Andrew J. James
Assistant Examiner—Stephen D. Meier
Attorney, Agent, or Firm—Bell, Seltzer, Park & Gibson

[57] ABSTRACT

A transition crystal structure is disclosed for providing a good lattice and thermal match between a layer of single crystal silicon carbide and a layer of single crystal gallium nitride. The transition structure comprises a buffer formed of a first layer of gallium nitride and aluminum nitride, and a second layer of gallium nitride and aluminum nitride adjacent to the first layer. The mole percentage of aluminum nitride in the second layer is substantially different from the mole percentage of aluminum nitride in the first layer. A layer of single crystal gallium nitride is formed upon the second layer of gallium nitride. In preferred embodiments, the buffer further comprises an epitaxial layer of aluminum nitride upon a silicon carbide substrate.

27 Claims, 7 Drawing Sheets

BUFFER STRUCTURE BETWEEN SILICON CARBIDE AND GALLIUM NITRIDE AND RESULTING SEMICONDUCTOR DEVICES

FIELD OF THE INVENTION

The present invention relates to semiconductor devices formed using gallium nitride, and in particular relates to a method of forming gallium nitride devices using silicon carbide substrates.

BACKGROUND OF THE INVENTION

The present invention provides a gallium nitride (GaN) structure and resulting devices. Gallium nitride is a semiconductor compound of interest because its direct bandgap provides it with the potential to emit blue light with high efficiency.

The blue portion of the visible spectrum and the adjacent ultraviolet (UV) wavelengths (approximately 500–350 nanometers; 2.5–3.16 eV) are considered important regions of the entire electromagnetic spectrum. In spite of the interest in producing semiconductor devices that emit blue, violet or ultraviolet wavelengths (or corresponding detector devices), efforts to develop such devices has been difficult at best and unsuccessful in most cases. Presently, many light-emitting diodes ("LEDs," also referred to as "semiconductor optical devices") are available which can produce light or electromagnetic radiation from the infrared to the green wavelengths (approximately 1000–500 nanometers; 1.2–2.5 eV). As recognized by anyone familiar with the production of color and color images, however, blue light is also required as the third primary color of the visible spectrum in order to give complete full color imaging and graphics in appropriate applications.

Gallium nitride (GaN) is an interesting candidate for blue light-emitting diodes because of its relatively direct wide bandgap. As is known to those familiar with semiconductor materials and devices, and the interaction of semiconductor materials with light, the color of light as seen by the human eye represents a wavelength (or its corresponding frequency). In turn, the wavelength and frequency correspond to a given energy value. Thus, particular colors of the visible spectrum can only be produced by materials in which energy transitions of the required amount can take place. Stated most simply, the color that can be produced by a light-emitting diode of a given semiconductor material is a direct function of the material's bandgap. Wider bandgaps permit greater energy transitions which in turn produce higher energy photons leading to higher frequency (lower wavelength) colors (frequency being directly proportional to the energy transition and wavelength being inversely proportional to frequency).

Gallium nitride has a sufficient bandgap (3.4 eV) to emit any color in the visible spectrum, and particularly blue light, but suffers from certain fundamental difficulties. One difficulty in using gallium nitride for semiconductor light-emitting diodes is the difficulty in identifying a suitable substrate material. As is well known to those familiar with such devices, LEDs emit light when current (a flow of electrons) passes across a junction between p-type and n-type layers of a semiconductor material. When electrons and electron vacancies (holes) recombine, photons are emitted of a wavelength corresponding in some fashion to the material's bandgap as set forth above. Generally speaking, such layers, however, must be characterized as single crystal ("epitaxial") layers. This in turn requires that they be grown on a suitable substrate. Therefore, as is known to those familiar with crystal growth, the substrate will greatly influence the epitaxial growth mechanism and quality that will take place upon it. In general, in order for a desired type of epitaxial growth to take place, the crystal lattice parameters of the substrate and those of the epitaxial layer must be either identical or reasonably close to one another. A crystal layer may grow on a non-matching substrate, but it will grow in an amorphous form or full of defects, either of which will essentially destroy its useful electronic or electro-optical properties. It is well established that the crystal structures of epitaxial layers of gallium nitride are very strongly influenced by the substrate material and its orientation.

Identifying a suitable substrate for gallium nitride has been a difficult task for researchers as gallium nitride bulk substrates have never been successfully produced. Sapphire ($Al_2O_3$) has been the primary substrate choice. To date, sapphire has provided a somewhat useful, although less than ideal, thermal and crystal match for gallium nitride.

Sapphire has one glaring disadvantage: its lack of conductivity; i.e., sapphire is very difficult to dope to produce a conductive substrate. In device manufacture, if a substrate lacks conductivity, then all of the electrical contacts to the device (usually two contacts for LEDs) must be made other than to the substrate. As a result, gallium nitride devices formed on sapphire substrates typically require that at least two electrical leads be placed on the same surface of the device.

A different LED structure is often preferred, however, which is referred to as a "vertical" structure, and one requiring that the LED be formed on a conductive substrate. In vertical LEDs, electrical contacts can be made to the top and bottom of the device rather than both two on the top, or one or both on the side, all of which arrangements are usually more difficult to engineer than is the top and bottom contact orientation of a typical LED.

One proposed candidate material for a conductive substrate for gallium nitride, and thus for vertical GaN LEDs, is silicon carbide (SIC). Silicon carbide has an appropriate thermal match with gallium nitride, i.e., the coefficients of linear expansion for both materials are quite similar. Silicon carbide can be conductively doped, and indeed is a blue light-emitter in its own right; see e.g., Edmond, et al. U.S. Pat. Nos. 4,918,497 and 5,027,168, both of which are assigned to the assignee of the present invention.

Silicon carbide has a better, but not identical lattice match with gallium nitride, however, making high quality epitaxial layers of GaN difficult to produce directly on SiC. SIC's lattice match is closer to GaN, however, than is sapphire's (sapphire has a 15% lattice mismatch with GaN, SiC has 3.5% mismatch). Thus, successful vertical devices of gallium nitride on silicon carbide have yet to appear in commercial quantities.

A number of the characteristics of gallium nitride, the difficulties in working with it, and attempted solutions to these problems are set forth by Strite and Morkoc, *GaN, AlN, and InN: A Review*, J. Vac. Sci. Technol. B., 10(4), July/August 1992, pp. 1237–1266.

OBJECT AND SUMMARY OF THE INVENTION

Therefore, it is an object of the present invention to provide a structure with a good lattice and coefficient of thermal expansion match between a layer single crystal silicon carbide and a layer of single crystal gallium nitride in order to produce such vertical devices.

The invention meets this object with a transition crystal structure that provides a good lattice and thermal match between single crystal silicon carbide and the layer of single crystal gallium nitride. The transition structure comprises a buffer formed of a first layer of gallium nitride and aluminum nitride (AlN), and a second layer of gallium nitride and aluminum nitride adjacent to the first layer and in which the mole percentage of aluminum nitride is substantially different from the mole percentage of aluminum nitride in the first layer.

In another embodiment, the invention comprises device precursor structures that incorporate the buffer layer, and in yet another embodiment, the invention comprises various vertical devices themselves that incorporate the novel buffer layer.

The foregoing and other objects and advantages of the invention will be understood more clearly when taken in conjunction with the following detailed description and the drawings in which:

DETAILED DESCRIPTION

The present invention is a transition crystal structure for providing a good lattice and thermal (coefficient of thermal expansion) match between single crystal silicon carbide and a layer of single crystal gallium nitride. The transition structure is schematically illustrated in cross-section in FIG. 1 and is broadly designated at 20. The predominant feature of the transition structure is a buffer designated by the brackets at 21. The buffer is formed of a first layer of gallium nitride and aluminum nitride 22 and a second layer 23 of gallium nitride and aluminum nitride adjacent to the first layer 22. The mole percentage of aluminum nitride in the second layer 23 is substantially different from the mole percentage of aluminum nitride in the first layer 22.

Figure 1:
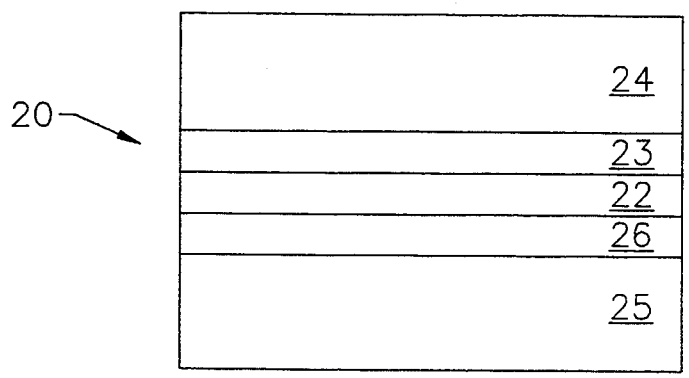
FIG. 1 is a schematic cross-sectional view of a transition structure according to the present invention.

As FIG. 1 further illustrates, the transition structure includes a layer of single crystal gallium nitride 24 upon the second layer 23 of gallium nitride and aluminum nitride as well as a single crystal substrate of silicon carbide 25 and a layer of aluminum nitride 26 upon the silicon carbide substrate.

In the preferred embodiments, the percentage of gallium nitride in the first layer 22 is greater than the mole percentage of aluminum nitride in that layer. In the second layer 23, however, the mole percentage of aluminum nitride is greater than the mole percentage of gallium nitride. This is a somewhat unexpected structure which has nevertheless been found to give excellent results. The success of the structure is surprising because under a normal analysis, it would be anticipated that the layer with the greater mole percent of gallium nitride would provide a better match to the pure gallium nitride layer. Instead, in the present invention, the layer 23 with the smaller mole percentage of gallium nitride is directly adjacent the epitaxial layer of gallium nitride 24.

In preferred embodiments of the structure illustrated in FIG. 1, the first layer of gallium nitride and aluminum nitride 22 is between about 20 and 50 mole percent aluminum nitride with a mole percentage of about 30 percent aluminum nitride being most preferred. In the second layer 23, the mole percentage of aluminum nitride is between about 60 and 95 percent, with a mole percentage of about 90 percent aluminum nitride most preferred.

Figure 6:
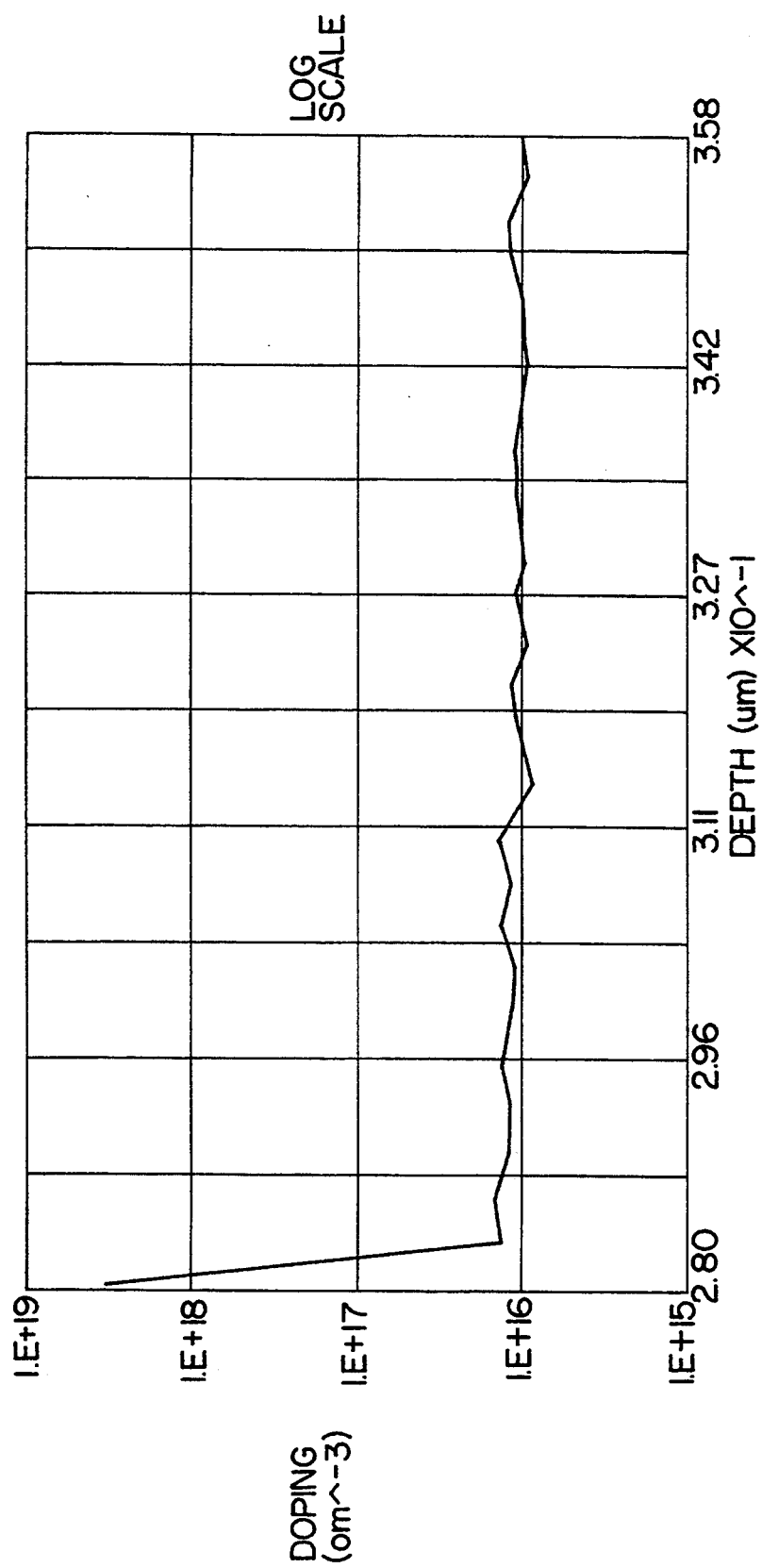
FIG. 6 is a plot of doping level versus depth, measured by differential capacitance-voltage measurements using mercury (Hg) contacts for a gallium nitride epitaxial layer according to the present invention.

As known to those familiar with this art, and as specifically set forth in some of the references cited herein and with this application, one of the measures of the quality of the substrate and any buffer layer is the resulting crystal quality of the desired layer of gallium nitride, in this case the layer 24. Using the buffer 21 of the present invention, gallium nitride layers have been formed with donor concentrations as low as about $1 \times 10^{16}$ cm$^{-3}$ (FIG. 6).

FIG. 1 further demonstrates that in another embodiment, the invention can comprise a vertical device precursor structure formed of a silicon carbide substrate 25, the buffer 21 on the substrate 25, and a single crystal layer 24 of gallium nitride on the buffer. As set forth above, the buffer 21 is most preferably formed of three layers, a layer of aluminum nitride 26 on the silicon carbide, a first layer of gallium nitride and aluminum nitride 22 in which the mole percentage of gallium nitride is greater than the mole percentage of aluminum nitride, and a second layer of gallium nitride and aluminum nitride 23 adjacent to the first layer 22 and in which the mole percentage of aluminum nitride is greater than the mole percentage of gallium nitride.

Figure 2:
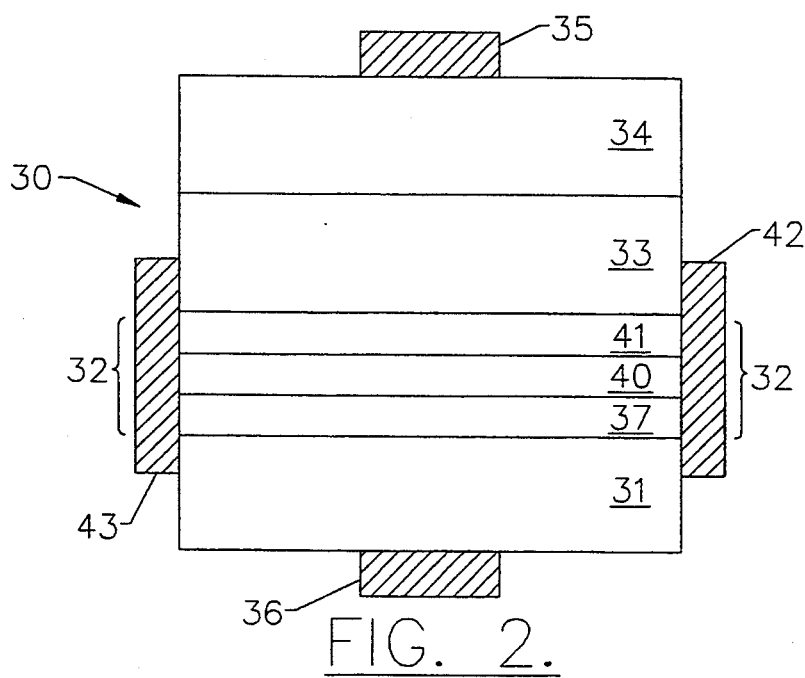
FIG. 2 is a schematic cross-sectional view of a light-emitting diode according to the present invention.
Figure 3:
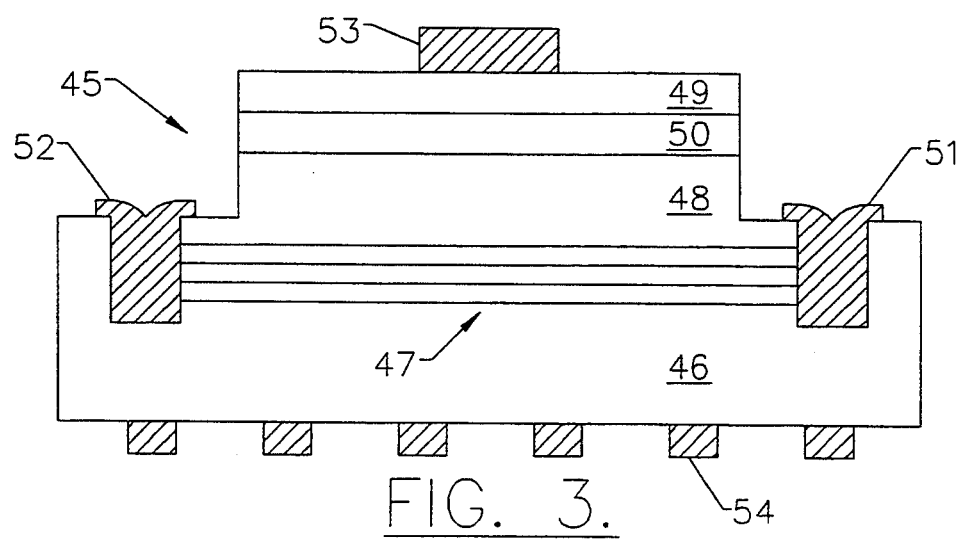
FIG. 3 is a cross-sectional schematic view of yet another light-emitting diode.
Figure 4:
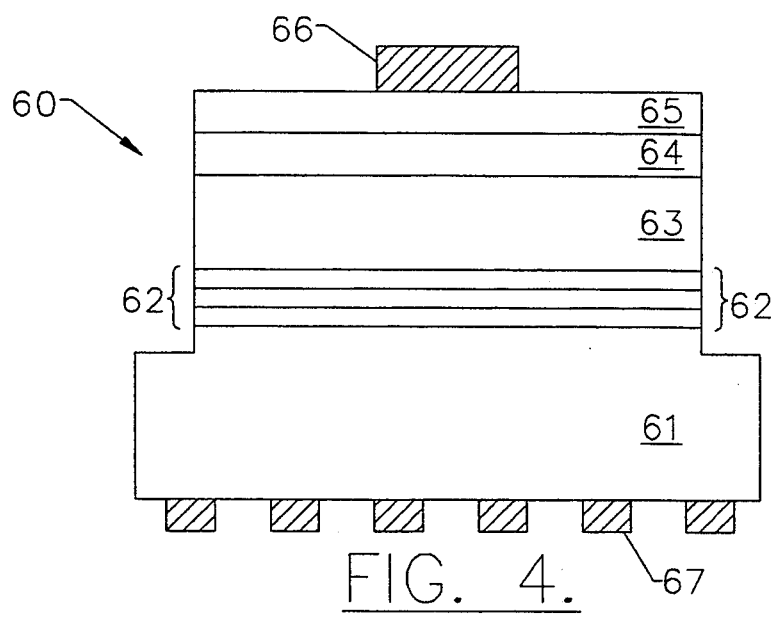
FIG. 4 is a third embodiment of a light-emitting diode that incorporates the structure of the present invention.

The advantages of the buffer structure and the vertical device precursors that can be formed from it are in turn illustrated in FIGS. 2, 3 and 4 which illustrate various embodiments of vertical light-emitting diodes. FIG. 2 illustrates a light-emitting diode broadly designated at 30. The diode 30 comprises a single crystal silicon carbide substrate 31, a buffer designated by the bracket at 32, a first single crystal layer of gallium nitride 33 on the buffer 32 and having a first conductivity type, and a second single crystal layer of gallium nitride 34 upon the first layer 33, with the second layer having the opposite conductivity type from the first layer so that the first and second layers 33 and 34 form a p-n junction therebetween. Ohmic contacts 35 and 36 are made to the substrate 31 and to the second gallium nitride layer 34.

As in the previous embodiment, the buffer 32 comprises an epitaxial layer of aluminum nitride 37 on the silicon carbide substrate 31, a first layer of gallium nitride and aluminum nitride 40 in which the mole percentage of gallium nitride is greater than the mole percentage of aluminum nitride, and a second layer of gallium nitride and aluminum nitride 41 adjacent to the first layer, and in which the mole percentage of aluminum nitride is greater than the mole percentage of gallium nitride.

In the embodiment of FIG. 2, the buffer 32 is undoped and acts as an insulator, and thus the illustrated LED 30 further comprises shorting contacts 42 and 43 for providing an electrical path between the substrate 31 and the first single crystal layer of gallium nitride 33.

FIG. 3 shows a second LED embodiment according to the present invention broadly designated at 45. The diode 45 includes a silicon carbide substrate 46, the buffer broadly designated by the bracket at 47, a first layer of gallium nitride 48, a second layer of gallium nitride 49 having the opposite conductivity type from the layer 48, and a layer of a gallium nitride alloy 50 between the respective gallium nitride layers 48 and 49. The alloy layer 50 has the same conductivity type as the first layer 48 of gallium nitride so that a p-n junction is formed between the second gallium nitride layer 49 and the gallium nitride alloy layer 50. Such a structure is referred to in the art as a double heterostructure which helps confine current to the alloy layer region for greater efficiency in the overall device. The substrate 46 also has the same conductivity type as the first gallium nitride layer 48.

In preferred embodiments, the alloy layer comprises indium gallium nitride (InGaN) and results in a device which demonstrates a peak emission at a wavelength of between about 410 and 470 nanometers (nm). Gallium nitride also has the capacity to produce other colors at high efficiency, including green light (e.g., 470–560 nm).

FIG. 3 also illustrates a set of shorting contacts 51 and 52 as well as respective ohmic contacts 53 and 54 to the second gallium nitride layer, and to the silicon carbide substrate 46.

FIG. 4 illustrates a third LED embodiment according to the invention, and in which the buffer is conductively doped to thereby eliminate the use of the shorting contacts. More specifically, FIG. 4 shows a diode 60 with a silicon carbide substrate 61, the buffer structure illustrated by the brackets at 62, the first gallium nitride layer 63, the gallium nitride alloy layer 64, and the second layer of gallium nitride 65. The ohmic contacts are respectively illustrated at 66 to the gallium nitride layer 65, and at 67 to the silicon carbide substrate 61. As in the embodiment of FIG. 3, the alloy layer 64 has the opposite conductivity from the second gallium nitride layer 65, and forms a p-n junction therewith. Alloy layer 64, however, has the same conductivity as the first GaN layer 63 and the SiC substrate 61.

Because the device of FIG. 4 has a conductive buffer structure, the shorting contacts illustrated in FIGS. 2 and 3 are not required.

In some specific examples of the invention, single crystal gallium nitride layers with thicknesses up to 6 microns were grown on 6H silicon carbide substrates. A half width of the x-ray rocking curve ($\theta$-$2\theta$ scan) was 54 arc seconds. Stimulated emission from photopumped gallium nitride layers grown on SiC was observed for the first time. The wavelength of the stimulated emission was 376 nm at 300K.

Unintentionally doped layers were typically doped to a concentration of about $10^{16}$ cm$^{-3}$ ($N_d$-$N_a$). For doped n-type layers, the net donor concentration was controlled from $1 \times 10^{17}$ to $4 \times 10^{18}$ cm$^{-3}$ and for p-layers, the concentration $N_a$-$N_d$ was controlled from $1 \times 10^{17}$ to $2 \times 10^{18}$ cm$^{-3}$. Blue light-emitting diodes were fabricated from these layers. Edge emission at the wavelength of 375 nm was observed in the electroluminesce spectrum with a peak of between about 410 and 470 nm.

The invention thus results in a gallium nitride device of extremely high quality because of the low number of crystal defects, the conductive silicon carbide substrate, and the resulting combination of the excellent gallium nitride on the conductive silicon carbide.

The silicon carbide substrates can be grown in the manner exemplified in U.S. Pat. No. 4,866,005 to Carter, et al., and the gallium nitride, gallium nitride alloy, and buffer layers were all grown using otherwise conventional chemical vapor deposition (CVD) techniques. Although various parameters for gas flow, pressure, and temperature in CVD epitaxial growth can differ from system to system, the layers described herein can be grown in the manner described using other systems and without undue experimentation by those of ordinary skill in this art.

Figure 5:
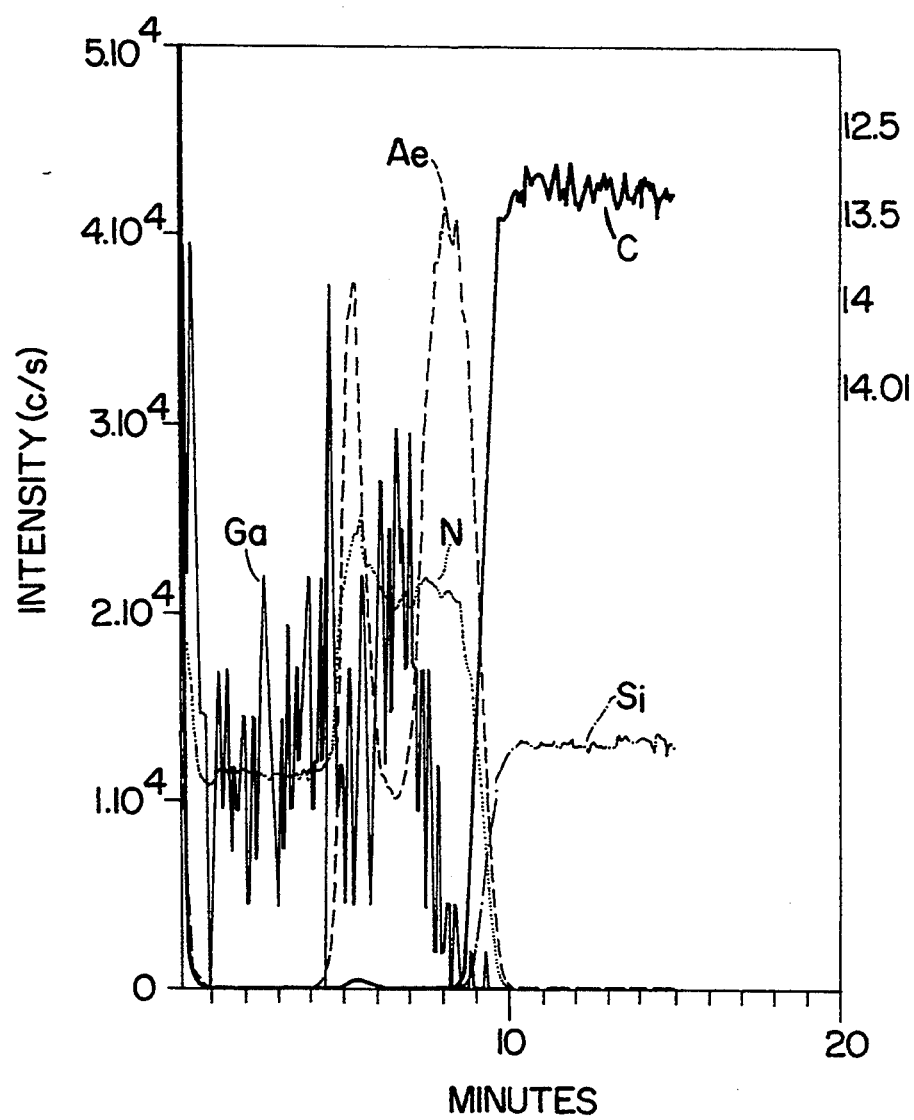
FIG. 5 is a secondary ion mass spectrometer (SIMS) depth profile of a transition crystal structure according to the present invention and illustrating its composition.

FIG. 5 is a SIMS profile further demonstrating the structural features of the invention. As noted therein (and going from right to left), the scan illustrates the presence of silicon and carbon (i.e., SiC) followed by aluminum and nitrogen (AlN) nitride, then gallium and aluminum and nitrogen (GaN and AlN), and finally gallium and nitrogen (GaN) as the top layer.

FIG. 6 is a plot of doping versus depth and shows the extremely low native donor concentration (1E16) of epitaxial layers of gallium nitride grown on silicon carbide using the present invention.

Figure 7:
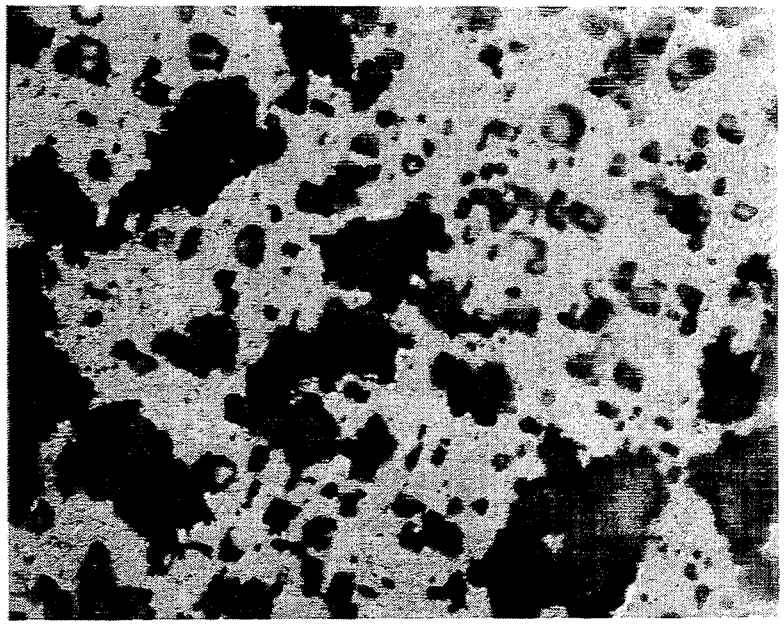
FIGS. 7–9 are optical micrographs of crystal surfaces that do not incorporate the present invention.
Figure 8:
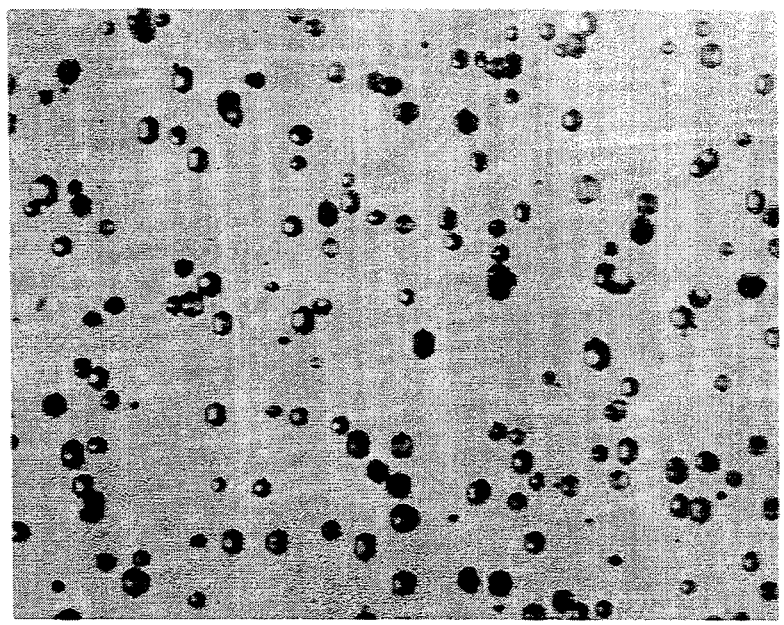
Figure 9:
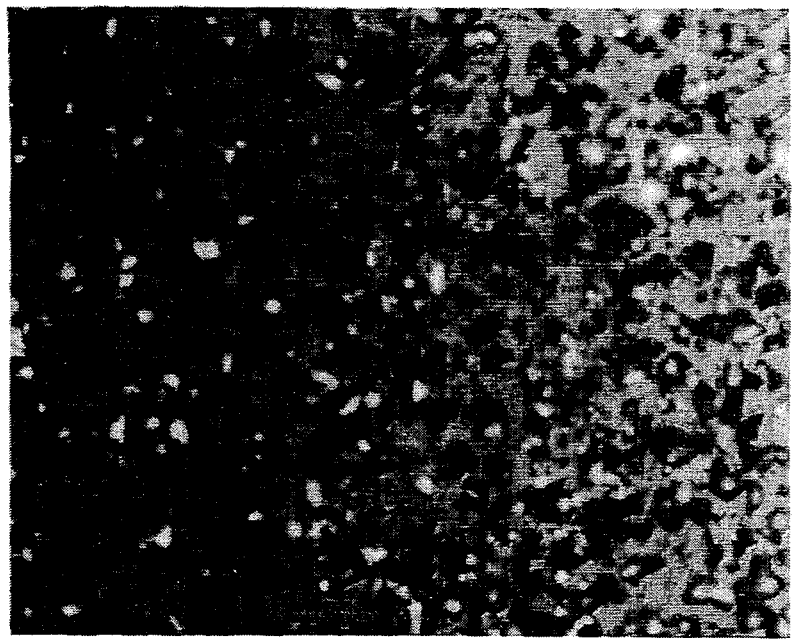

FIGS. 7, 8 and 9 are optical micrographs taken at magnifications of between 200 and 400X illustrating the undesirable results when an attempt is made to grow gallium nitride directly on silicon carbide.

Figure 10:
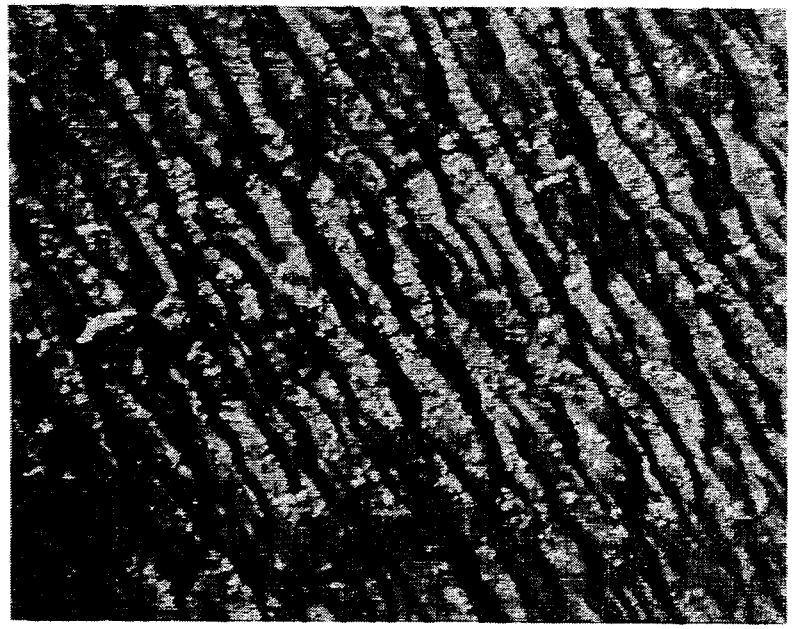
FIGS. 10–12 are optical micrographs of the surfaces of crystals of gallium nitride that incorporate the structure of the present invention.

FIG. 10 illustrates a gallium nitride surface and shows slightly improved results when a less than optimum buffer is used.

Figure 11:
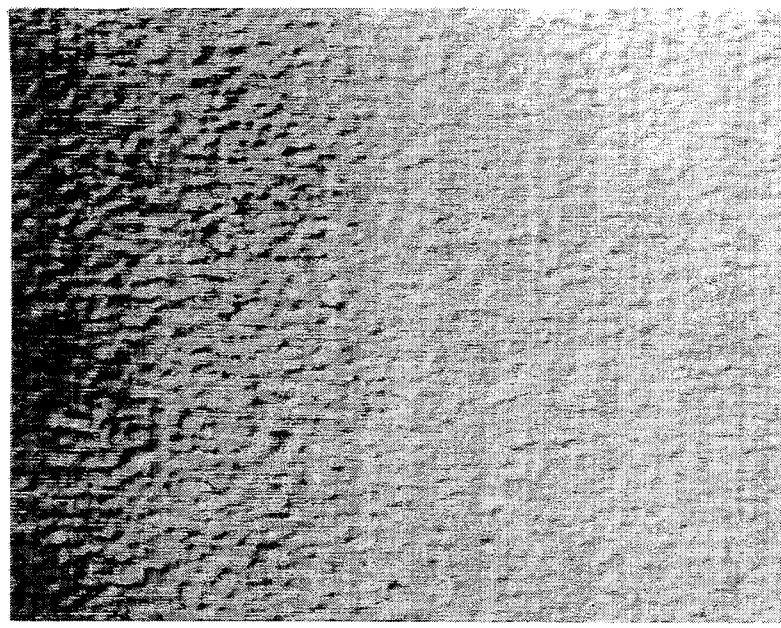
Figure 12:
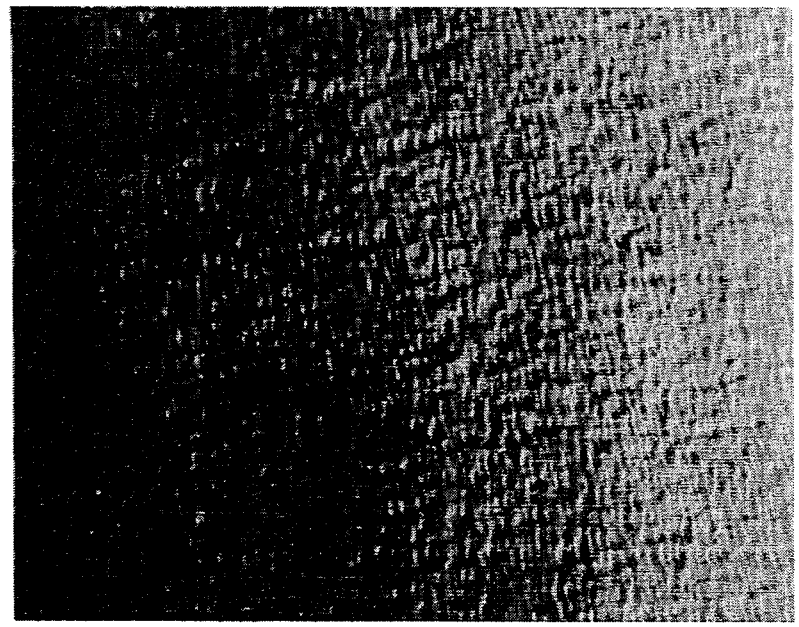

FIGS. 11 and 12, also taken at 400X, show the advantages of the invention, specifically the relatively smooth and defect-free texture of the GaN crystal surface, particularly in comparison to FIGS. 7-10.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A transition crystal structure for providing a good lattice and thermal match between single crystal silicon carbide and a layer of single crystal gallium nitride, said transition structure comprising:

a buffer formed of a first layer of gallium nitride and aluminum nitride; and a second layer of gallium nitride and aluminum nitride adjacent to said first layer, and in which the mole percentage of aluminum nitride in said second layer is substantially different from the mole percentage of aluminum nitride in said first layer; and a layer of single crystal gallium nitride upon said second layer of gallium nitride and aluminum nitride.

2. A structure according to claim 1 wherein the mole percentage of gallium nitride in said first layer is greater than the mole percentage of aluminum nitride in said first layer; and
wherein the mole percentage of aluminum nitride in said second layer is greater than the mole percentage of gallium nitride in said second layer.

3. A structure according to claim 2 further comprising a single crystal silicon carbide substrate; and
said buffer further comprising an epitaxial layer of aluminum nitride upon said silicon carbide substrate.

4. A structure according to claim 3 wherein said first layer of gallium nitride and aluminum nitride is between about 20 and 50 mole percent aluminum nitride.

5. A structure according to claim 3 wherein said first layer of gallium nitride and aluminum nitride is about 30 mole percent aluminum nitride.

6. A structure according to claim 3 wherein said second layer of gallium nitride and aluminum nitride is between about 60 and 95 mole percent aluminum nitride.

7. A structure according to claim 3 wherein said second layer of gallium nitride and aluminum nitride is about 90 mole percent aluminum nitride.

8. A structure according to claim 3 wherein said substrate is selected from the group consisting of the 6H, 4H, and 3C polytypes of silicon carbide.

9. A vertical device precursor structure comprising:
a single crystal silicon carbide substrate;
a buffer upon said substrate; and
a single crystal layer of gallium nitride upon said buffer;
wherein said buffer comprises,
an epitaxial layer of aluminum nitride upon said silicon carbide substrate
a first layer of gallium nitride and aluminum nitride; and
a second layer of gallium nitride and aluminum nitride adjacent to said first layer, and in which the mole percentage of aluminum nitride in said second layer is substantially different from the mole percentage of aluminum nitride in said first layer.

10. A structure according to claim 9 wherein the mole percentage of gallium nitride in said first layer is greater than the mole percentage of aluminum nitride in said first layer; and
wherein the mole percentage of aluminum nitride in said second layer is greater than the mole percentage of gallium nitride in said second layer.

11. A vertical device precursor according to claim 9 wherein said first layer of gallium nitride and aluminum nitride is between about 20 and 50 mole percent aluminum nitride.

12. A vertical device precursor according to claim 9 wherein said first layer of gallium nitride and aluminum nitride is about 30 mole percent aluminum nitride.

13. A vertical device precursor according to claim 9 wherein said second layer of gallium nitride and aluminum nitride is between about 60 and 95 mole percent aluminum nitride.

14. A vertical device precursor according to claim 9 wherein said second layer of gallium nitride and aluminum nitride is about 90 mole percent aluminum nitride.

15. A vertical device precursor according to claim 9 wherein said substrate is selected from the group consisting of the 6H, 4H, and 3C polytypes of silicon carbide.

16. A vertical light emitting diode formed from single crystal gallium nitride upon single crystal silicon carbide, said light emitting diode comprising:
a single crystal silicon carbide substrate;
a buffer upon said substrate;
a first single crystal layer of gallium nitride upon said buffer and having a first conductivity type;
a second single crystal layer of gallium nitride upon said first gallium nitride layer, and having the opposite conductivity type from said first gallium nitride layer, said first and second layers forming a p-n junction therebetween; and
ohmic contacts to said substrate and to said second gallium nitride layer;
wherein said buffer comprises,
an epitaxial layer of aluminum nitride upon said silicon carbide substrate,
a first layer of gallium nitride and aluminum nitride, and
a second layer of gallium nitride and aluminum nitride adjacent to said first layer, and in which the mole percentage of aluminum nitride in said second layer is substantially different from the mole percentage of aluminum nitride in said first layer.

17. A light emitting diode according to claim 16 wherein said buffer is conductively doped.

18. A light emitting diode according to claim 16 wherein said buffer is an insulator and wherein said diode further comprises shorting contacts between said substrate and said first single crystal layer of gallium nitride.

19. A light emitting diode according to claim 16 wherein said first layer of gallium nitride and aluminum nitride is between about 20 and 50 mole percent aluminum nitride.

20. A light emitting diode according to claim 16 wherein said first layer of gallium nitride and aluminum nitride is about 30 mole percent aluminum nitride.

21. A light emitting diode according to claim 16 wherein said second layer of gallium nitride and aluminum nitride is between about 60 and 95 mole percent aluminum nitride.

22. A light emitting diode according to claim 16 wherein said second layer of gallium nitride and aluminum nitride is about 90 mole percent aluminum nitride.

23. A light emitting diode according to claim 16 and further comprising an epitaxial layer of a gallium nitride alloy between said first and second layers of gallium nitride.

24. A light emitting diode according to claim 23 wherein said gallium nitride alloy comprises indium gallium nitride.

25. A light emitting diode according to claim 16 having a peak emission at a wavelength of between about 410 and 470 nanometers.

26. A light emitting diode according to claim 16 having a peak emission at a wavelength of between about 470 and 560 nanometers.

27. A light emitting diode according to claim 16 wherein said substrate comprises the 6H polytype of silicon carbide.

* * * * *

UNITED STATES PATENT AND TRADEMARK OFFICE
CERTIFICATE OF CORRECTION

PATENT NO. : 5,393,993
DATED : February 28, 1995
INVENTOR(S) : Edmond et al.

It is certified that error appears in the above-identified patent and that said Letters Patent is hereby corrected as shown below:

On title page, item

[56] References Cited:

First column, line 3, "Manabe" should be --Manabe et al.--.

First column, line 5, "Kotaki" should be --Kotaki et al.--.

Second column, line 3, "Akaski" should be --Akasaki--.

Second column, line 8, "of" (2nd occurrence) should be --on--.

Column 1, line 20, "3.16" should be --3.6--.

Column 2, line 9, "to ,one" should be --to one--.

Column 2, line 38, "LEDs,," should be --LEDs,--.

UNITED STATES PATENT AND TRADEMARK OFFICE
CERTIFICATE OF CORRECTION

PATENT NO. : 5,393,993
DATED : February 28, 1995
INVENTOR(S) : Edmond et al.

It is certified that error appears in the above-indentified patent and that said Letters Patent is hereby corrected as shown below:

Column 2, line 47, "(SIC")" should be —(SiC)—.

Signed and Sealed this

Fifth Day of December, 1995

Attest:

BRUCE LEHMAN

*Attesting Officer*    Commissioner of Patents and Trademarks